United States Patent
Sparing et al.

(10) Patent No.: US 9,504,161 B2
(45) Date of Patent: Nov. 22, 2016

(54) SOLUTION AND PROCESS FOR THE PRE-TREATMENT OF COPPER SURFACES USING AN N-ALKOXYLATED ADHESION-PROMOTING COMPOUND

(75) Inventors: Christian Sparing, Berlin (DE); Thomas Huelsmann, Berlin (DE); Arno Clicque, Berlin (DE); Patrick Brooks, Berlin (DE); Adrian Zee, Berlin (DE); Heiko Brunner, Berlin (DE)

(73) Assignee: ATOTECH DEUTSCHLAND GMBH, Berlin (DE)

( * ) Notice: Subject to any disclaimer, the term of this patent is extended or adjusted under 35 U.S.C. 154(b) by 576 days.

(21) Appl. No.: 13/884,711

(22) PCT Filed: Oct. 24, 2011

(86) PCT No.: PCT/EP2011/068510
§ 371 (c)(1),
(2), (4) Date: Nov. 15, 2013

(87) PCT Pub. No.: WO2012/062557
PCT Pub. Date: May 18, 2012

(65) Prior Publication Data
US 2014/0076461 A1    Mar. 20, 2014

(30) Foreign Application Priority Data
Nov. 10, 2010 (EP) .................................... 10190611

(51) Int. Cl.
C23C 22/48 (2006.01)
C23F 1/18 (2006.01)
H05K 3/00 (2006.01)
H05K 3/38 (2006.01)

(52) U.S. Cl.
CPC . *H05K 3/00* (2013.01); *C23F 1/18* (2013.01); *H05K 3/383* (2013.01); *H05K 2203/124* (2013.01)

(58) Field of Classification Search
CPC ........................ C23F 1/18; H05K 3/383; H05K 2203/124; C23C 22/48
See application file for complete search history.

(56) References Cited

U.S. PATENT DOCUMENTS

| 3,645,772 | A | | 2/1972 | Jones |
| 4,051,057 | A | | 9/1977 | Ericson et al. |
| 4,557,898 | A | | 12/1985 | Greene et al. |
| 4,917,758 | A | | 4/1990 | Ishizuka et al. |
| 5,411,670 | A | * | 5/1995 | Walker ..................... C09K 8/54 106/14.11 |
| 5,869,130 | A | | 2/1999 | Ferrier |
| 6,552,091 | B1 | | 4/2003 | Boinowitz et al. |
| 2002/0048685 | A1 | * | 4/2002 | Bishop ...................... C23F 1/18 428/687 |

FOREIGN PATENT DOCUMENTS

| EP | 0926265 | 6/1999 |
| EP | 1331287 | 7/2003 |
| EP | 1310142 | 5/2007 |
| JP | 02185992 H | 7/1990 |
| JP | 2002503040 A | 1/2002 |
| JP | 20020503041 A | 1/2002 |
| JP | 2008097559 | 4/2008 |
| WO | 96/19097 | 6/1996 |
| WO | 99/40764 | 8/1999 |
| WO | 99/40765 | 8/1999 |
| WO | 01/49805 | 7/2001 |
| WO | 02/079542 | 10/2002 |

OTHER PUBLICATIONS

Office Action filed in Japanese patent application JP 2013-538118, dated Aug. 4, 2015.
International Preliminary Report on Patentability issued in corresponding International Application No. PCT/EP2011/068510 dated Oct. 15, 2012.
International Search Report issued in corresponding International Application No. PCT/EP2011/068510 dated Jan. 19, 2012.
Written Opinion issued in corresponding International Application No. PCT/EP2011/068510 mailed Jan. 19, 2012.

\* cited by examiner

*Primary Examiner* — Lois Zheng
(74) *Attorney, Agent, or Firm* — Hunton & Williams LLP

(57) ABSTRACT

The invention concerns a solution for pretreating copper surfaces, and a method for pre-treating copper surfaces allowing the formation of a tight bond to plastic substrates. The solution comprises: a) hydrogen peroxide, b) at least one acid, and c) at least one nitrogen-containing, five-membered, heterocyclic compound, and d) additionally at least one nitrogen containing, adhesion-promoting compound, said compound comprising, or consisting of, lactams, non-quaternary fatty amines, amides and polyamides, connected at one or more of its nitrogen atoms with at least one residue of formula (I).

9 Claims, No Drawings

SOLUTION AND PROCESS FOR THE PRE-TREATMENT OF COPPER SURFACES USING AN N-ALKOXYLATED ADHESION-PROMOTING COMPOUND

CROSS-REFERENCE TO RELATED APPLICATIONS

This application is the U.S. National Phase of International Application No. PCT/EP2011/068510, filed Oct. 24, 2011, which claims priority to European Patent Application No. 10190611.3, filed Nov. 10, 2010, the contents of each are hereby incorporated by reference in their entireties.

The invention concerns a solution and a process to pretreat copper surfaces so that a tight bond can be subsequently formed between the pretreated copper surfaces and plastic substrates. The solution preferably serves to pretreat copper-coated inner layers of printed circuit boards to subsequently allow a tight bond between the inner layers of the printed circuit board and the board's inner layers made of artificial resins.

In manufacturing printed circuit boards, various steps are carried out in which copper surfaces must be tightly bonded to an organic substrate. In some cases, the required adhesion of the formed bonds must be ensured over a long period. In other cases, a tight bond only has to exist for a short period, e.g. when the organic substrate only remains on the copper surfaces during manufacture of the printed circuit board. For example, the tight bond of dry film plating resists (for structuring conductor lines on printed circuit boards) to the copper surfaces only has to exist while manufacturing the printed circuit board. After the conductor line structures are formed, the resists can be removed.

The easiest way to increase the adhesion is to etch and hence roughen the copper surfaces before forming the bond. Microetching solutions are used such as sulfuric acid solutions of hydrogen peroxide or sodium peroxodisulfate.

Another procedure is described in U.S. Pat. No. 3,645,772. A pretreatment solution is used for the copper surfaces that e.g. contains 5-aminotetrazole.

Long-term stability is especially necessary when laminating multilayer printed circuit boards. Other treatments for the copper surfaces are required in this case.

When manufacturing multilayer boards, several inner layers are laminated to insulating artificial resin layers (so-called prepregs: e.g., epoxide resin films reinforced with fiberglass nets). The inner bonds of the laminate must hold throughout the entire life of the printed circuit board. The copper layers (preferably the conductor line structures) on the inner layers must be surface-treated. Various procedures have been developed to solve this problem.

The normal procedure for pretreating the materials before lamination is to form an oxide layer on the copper surfaces. In this process, known as the brown or black oxide process, very aggressive reaction conditions are used to form the oxide. A disadvantage of this procedure is that the oxide layer used for enhancing adhesion to the artificial resin layer is not very resistant to acid and especially to hydrochloric treatment solutions. They are hence attacked in subsequent processes for plating the through-holes in the boards. The adhesive bond is eliminated, and delamination occurs at the attacked sites (pink ring: An externally-visible attack on the black oxide layer directly next to a hole in printed circuit boards with the discoloration of the originally black oxide layer. The pink copper coating of the inner layer is recognizable as an annular defect; wedge void: A defect (recognizable in a micrograph of a treated hole) in a printed circuit board in the form of a crack between a copper inner layer and the neighboring printed circuit board resin from the attack of acid treatment solutions on the black oxide layer).

The above-cited problem is solved by reducing the oxide layer surface before lamination. The reduced black oxide is more stable than normal black oxide against chemicals used in plating the through-holes. The additional reduction step costs a great deal, however. In addition, the chemicals used for reduction are not very resistant to oxidation from air, so that the useful life of the baths and storage life of the supplementary chemicals are limited. An attempt to eliminate this problem is made in JP A 08097559. The reduced copper oxide layers are provided with a protective layer by treating them with an aqueous solution containing an aminothiazole and/or aminobenzothiazole compound. However, the problems of expensive reduction chemicals, their low resistance to oxidation and the layer's sensitivity to acid are not completely eliminated.

Another option for promoting adhesion is to treat the copper surfaces with an aqueous or alcoholic solution of an azole compound. Such a procedure is e.g. presented in WO 96/19097 A1. The copper surfaces are treated with a solution that contains 0.1-20 weight percent hydrogen peroxide, an inorganic acid (e.g. sulfuric acid), an organic corrosion inhibitor (e.g. benzotrizole), and a wetting agent. The hydrogen peroxide etches the copper surface to produce microrough surfaces.

U.S. Pat. No. 4,917,758 discloses etching solutions that, however, serve to etch copper cladding on the materials of the printed circuit board. Hydrogen peroxide, sulfuric acid and a nitrogen-containing compound (preferably amino benzoic acid, amino tetrazole or phenylurea) are also in these solutions.

U.S. Pat. No. 5,869,130 describes a process for treating metal surfaces with a composition comprising an oxidizer, an acid, a corrosion inhibitor, a source of halide ions and optionally a water soluble polymer in order to increase the adhesion of polymeric materials to the metal surface. Most preferably, the water soluble polymer is a polymer of ethylene oxide, an ethylene oxide-propylene oxide copolymer, polyethylene glycols, polypropylene glycols or polyvinyl alcohols. Such polymers decompose rapidly in said composition, leading to a strongly decreasing peel strength during the process.

WO9940764 concerns solutions for the preliminary treatment of copper surfaces which are subsequently to be firmly bonded to organic substrates. The solution is used, in particular, for firmly bonding laminated multilayered printed circuit boards and for firmly bonding resists to the copper surfaces of printed circuit boards. The solutions contain (a) hydrogen peroxide; (b) at least one acid; (c) at least one nitrogen-containing, five-membered heterocyclic compound which does not contain any sulphur, selenium or tellurium atom in the heterocycle; and (d) at least one adhesive compound from the group consisting of sulfinic acids, seleninic acids, tellurinic acids, which are not identical to the acid (b), heterocyclic compounds containing at least one sulphur, selenium and/or tellurium atom in the heterocycle, and sulfonium, selenonium and telluronium salts. Moreover, WO9940764 describes a process to pretreat copper surfaces to allow a tight bond to be subsequently formed between the copper surfaces and plastic substrates in which the copper surfaces are brought into contact with the above-mentioned solution.

WO9940765 describes, in comparison to WO9940764, an alternative process for the preliminary treatment of copper surfaces which are subsequently to be firmly bonded to organic substrates. Copper surfaces are first brought into contact with a first solution containing hydrogen peroxide, at least one acid and at least one nitrogen-containing, five-membered heterocyclic compound which does not contain any sulphur, selenium or tellurium atom in the heterocycle. The copper surfaces are then brought into contact with a second solution containing at least one adhesive compound from the group consisting of sulfinic acids, seleninic acids, tellurinic acids, heterocyclic compounds containing at least one sulphur, selenium and/or tellurium atom in the heterocycle, as well as sulfonium, selenonium and telluronium salts. The process is used, in particular, for firmly bonding laminated multilayered printed circuit boards and for firmly bonding resists to the copper surfaces of printed circuit boards.

The object of the present invention was to provide a pretreatment solution and a process that can create a tight bond between the copper surfaces and plastic surfaces. A higher peel strength should be reached that is stable during the whole process. The process should be simple, easy to use, and inexpensive. It is also important that treatment with the solutions produce a material bond that is not problematic (no pink ring, wedge voids or resin flaws) in the subsequent printed circuit board manufacturing processes, e.g. plating through-holes in board materials. The used pretreatment solutions should therefore be suitable for manufacturing printed circuit boards.

These problems are is solved by the pretreatment solution cited in claim 1 and the treatment process cited in claim 8.

The pretreatment solution according to the invention is for pretreating copper surfaces to allow a tight bond to be formed with plastic substrates, and it comprises:
a) hydrogen peroxide,
b) at least one acid, and
c) at least one nitrogen-containing, five-membered, heterocyclic compound
and
d) additionally at least one nitrogen containing, adhesion-promoting compound selected from the group comprising, or consisting of, lactams, non-quaternary fatty amines, amides and polyamides, which is connected at one or more of its nitrogen atoms with at least one residue of formula (I)

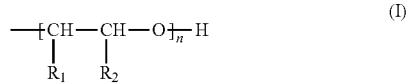

wherein
n is an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms, and
each $R_1$ and $R_2$ in a —(CHR$_1$—CHR$_2$—O)— moiety can be selected independently of each $R_1$ and $R_2$ in another —(CHR$_1$—CHR$_2$—O)— moiety,
with the proviso that the nitrogen-containing, five-membered, heterocyclic compound selected for component c) is not connected at any of its nitrogen atoms with a residue of formula (I).

With the pretreatment solution and the process of the invention a peel strength that is comparable to peel strengths known from the state of the art can be reached at lower etch depths than in the state of the art, which means shorter processing times and economic benefit.

The expression "at least one nitrogen containing, adhesion-promoting compound selected from the group comprising, or consisting of, lactams, fatty amines, amides and polyamides" means mixtures of different lactams, different fatty amines, different amides, and different polyamides as well as mixtures of two or more of a lactam, non-quaternary fatty amine, amide and polyamide.

Adhesion-promoting compounds are to be selected that are sufficiently soluble in the acidic, preferably sulfuric acid solution.

The pretreatment solution according to the invention, containing components a)-d), is hereinafter also abbreviated as "solution".

The problem on which the invention is based is solved in particular by the use of the solution according to claim 15, wherein the solution is used in the pre-treatment of printed circuit board inner layers, which have copper layers, for the formation of a firmly adhesive bonding between the printed circuit inner layers and synthetic resin layers. The cited solution is preferably used to pretreat copper-coated inner layers of printed circuit boards to allow a tight bond to be formed between the inner layers of the printed circuit boards and plastic resin layers.

The cited solution can also be used for the pre-treatment of printed circuit boards, which have copper layers, for the formation of a firmly adhesive bonding between the copper layers and resists formed from plastic materials.

The present invention moreover discloses the use of the compound d) as defined above for for preparing a solution for the pre-treatment of printed circuit board inner layers, which have copper layers, for the formation of a firmly adhesive bonding between the printed circuit inner layers and synthetic resin layers.

Preferred embodiments of the invention are found in the dependent claims.

The nitrogen-containing, five-membered, heterocyclic compound selected for component c) of the solution is not identical to the nitrogen-containing, adhesion-promoting compound selected for component d). There is at least the difference that the nitrogen-containing, five-membered, heterocyclic compound selected for component c) is not connected at any of its nitrogen atoms with a residue of above-cited formula (I).

In the present invention the term "aliphatic" means a hydrocarbon moiety characterized by a straight or branched chain arrangement of constituent carbon atoms and may be saturated or partially unsaturated with one, two or more double or triple bonds.

For the purpose of the present invention the term "alkyl" means a monovalent linear or branched saturated hydrocarbon moiety, having in the skeleton thereof but carbon atoms, wherein an alkyl moiety comprises all conceivable isomers thereof. For example, C1-C6 alkyl means methyl, ethyl, propyl, isopropyl, butyl, isobutyl, tert-butyl, pentyl, isopentyl, tert-pentyl, neo-pentyl, hexyl, 2-methyl pentyl, 3-methyl pentyl, 2,3-diethyl butyl and C1-C4 alkyl means methyl, ethyl, propyl, isopropyl, butyl, isobutyl, tert-butyl.

For the purpose of the present invention the term "alkylene" means a divalent linear or branched saturated hydrocarbon moiety, having in the skeleton thereof but carbon atoms, wherein an alkylene moiety comprises all conceivable isomers thereof.

The term "cycloalkyl" means a monovalent saturated or partially unsaturated, non-aromatic, carbocyclic moiety consisting of mono- or bicyclic rings. Cycloalkyl can optionally be substituted with one or more substituents, wherein each substituent is independently hydroxy, alkyl, alkoxy, halo, haloalkyl, amino, monoalkylamino, or dialkylamino, unless otherwise specifically indicated. Examples of cycloalkyl moieties include, but are not limited to, cyclopropyl, cyclobutyl, cyclopentyl, cyclohexyl, cycloheptyl, and the like, including partially unsaturated derivatives thereof such as cyclohexenyl, cyclopentenyl, and the like.

The term "cycloalkylene" means a divalent saturated or partially unsaturated, non-aromatic, carbocyclic moiety consisting of mono- or bicyclic rings. Cycloalkyl can optionally be substituted with one or more substituents, wherein each substituent is independently hydroxy, alkyl, alkoxy, halo, haloalkyl, amino, monoalkylamino, or dialkylamino, unless otherwise specifically indicated.

For the purpose of the present invention the term "alkenyl" means a monovalent linear or branched unsaturated hydrocarbon moiety, having in the skeleton thereof but carbon atoms, wherein an alkyl moiety comprises all conceivable isomers thereof.

"Aryl" means a monovalent cyclic aromatic hydrocarbon moiety consisting of a mono-, bi- or tricyclic aromatic ring. The aryl group can be optionally substituted. Examples of aryl moieties include, but are not limited to, phenyl, naphthyl, naphthalenyl, phenanthryl.

"Arylene" means a divalent cyclic aromatic hydrocarbon moiety consisting of a mono-, bi- or tricyclic aromatic ring. The arylene group can be optionally substituted.

As to formula (I) n is an integer from 1 to about 100, preferably 1 to about 50.

As stated above, each $R_1$ and $R_2$ in a —($CHR_1$—$CHR_2$—O)— moiety can be selected independently of each $R_1$ and $R_2$ in another —($CHR_1$—$CHR_2$—O)— moiety. Thereby, block-copolymer and random copolymer structures can occur. A block copolymer structure can for example occur, if first —($CHR_1$—$CHR_2$—O)— moieties follow to each other, followed by second —($CHR_1$—$CHR_2$—O)— moieties, wherein in the first moieties $R_1$ and/or $R_2$ are different from $R_1$ and/or $R_2$ in the second moieties.

$R_1$ is in one embodiment selected from hydrogen, alkyl, phenyl. $R_1$ is preferably $C_1$-$C_4$ alkyl or hydrogen, still more preferably methyl or ethyl or hydrogen, and most preferably methyl or hydrogen, and these can be combined with all above-cited values for n.

$R_2$ is in one embodiment selected from hydrogen, alkyl, phenyl. $R_2$ is preferably $C_1$-$C_4$ alkyl or hydrogen, still more preferably methyl or ethyl or hydrogen, and most preferably methyl or hydrogen, and these can be combined with all above-cited values for n and all above-cited $R_1$.

In one embodiment, which can be combined with all above-cited values for n, $R_1$ in the residue of formula (I) is hydrogen and $R_2$ is a hydrocarbon residue with 1 to about 6 carbon atoms, preferably alkyl or phenyl, more preferably $C_1$-$C_4$ alkyl, still more preferably methyl or ethyl, and most preferably methyl. As stated above, each $R_1$ and $R_2$ in a —($CHR_1$—$CHR_2$—O)— moiety can be selected independently of each $R_1$ and $R_2$ in another —($CHR_1$—$CHR_2$—O)— moiety. In a special embodiment, $R_1$ in all —($CHR_1$—$CHR_2$—O)— moieties is hydrogen and $R_2$ in all —($CHR_1$—$CHR_2$—O)— moieties is methyl. In another special embodiment, $R_1$ in all —($CHR_1$—$CHR_2$—O)— moieties is hydrogen and $R_2$ in all —($CHR_1$—$CHR_2$—O)— moieties is ethyl.

In another embodiment, which can be combined with all above-cited values for n, $R_1$ in formula (I) is a hydrocarbon residue with 1 to about 6 carbon atoms, preferably alkyl, or phenyl, more preferably $C_1$-$C_4$ alkyl, still more preferably methyl or ethyl, and most preferably methyl, and $R_2$ is hydrogen. In a special embodiment, $R_2$ in all —($CHR_1$—$CHR_2$—O)— moieties is hydrogen and $R_1$ in all —($CHR_1$—$CHR_2$—O)— moieties is methyl. In another special embodiment, $R_2$ in all —($CHR_1$—$CHR_2$—O)— moieties is hydrogen and $R_1$ in all —($CHR_1$—$CHR_2$—O)— moieties is ethyl.

In a further embodiment, which can be combined with the aforementioned embodiments, $R_1$ plus $R_2$ contain 6 carbon atoms in maximum, more preferably 4 carbon atoms in maximum.

In a highly preferred embodiment $R_1$ is hydrogen or methyl and $R_2$ is hydrogen or methyl, wherein each $R_1$ and $R_2$ in a —($CHR_1$—$CHR_2$—O)— moiety can be selected independently of each $R_1$ and $R_2$ in another —($CHR_1$—$CHR_2$—O)— moiety, and with the proviso that, in each moiety, $R_1$ is hydrogen if $R_2$ is methyl, and with the proviso that $R_2$ is hydrogen if $R_1$ is methyl.

In another highly preferred embodiment, $R_1$ and $R_2$ in all —($CHR_1$—$CHR_2$—O)— moieties are hydrogen.

In view of the above disclosure, the residue of formula (I) is in highly preferred embodiments a polyethylene glycol (PEG) or a polypropylene glycol (PPG) residue.

The invention also discloses a pretreatment solution for pretreating copper surfaces to allow a tight bond to be formed with plastic substrates, which comprises:
  a) hydrogen peroxide,
  b) at least one acid, and
  c) at least one nitrogen-containing, five-membered, heterocyclic compound
  and
  d) additionally at least one nitrogen containing, adhesion-promoting compound, obtainable, or obtained, by alkoxylation of a lactam, fatty amine, amide or polyamide with one or more compounds of formula (Ia),

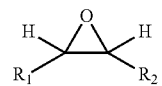

(Ia)

wherein
$R_1$ is hydrogen or a hydrocarbon residue with 1 to about 6 carbon atoms,
$R_2$ is hydrogen or a hydrocarbon residue with 1 to about 6 carbon atoms, and
with the proviso that the nitrogen-containing, five-membered, heterocyclic compound selected for component c) is not alkoxylated at any of its nitrogen atoms with a compound of formula (Ia), and that the product obtainable, or obtained, by alkoxylation of a fatty amine is a non-quaternary fatty amine.

$R_1$ in formula (Ia) is in one embodiment selected from hydrogen, alkyl, phenyl. $R_1$ is preferably $C_1$-$C_4$ alkyl or hydrogen, still more preferably methyl or ethyl or hydrogen, and most preferably methyl or hydrogen.

$R_2$ in formula (Ia) is in one embodiment, which can be combined with the all embodiments of $R_1$, selected from hydrogen, alkyl, phenyl. $R_2$ is preferably $C_1$-$C_4$ alkyl or hydrogen, still more preferably methyl or ethyl or hydrogen, and most preferably methyl or hydrogen.

In one embodiment, one of $R_1$ or $R_2$ in formula (Ia) is hydrogen and the other is a hydrocarbon residue with 1 to about 6 carbon atoms, preferably alkyl or phenyl, more preferably $C_1$-$C_4$ alkyl, still more preferably methyl or ethyl, and most preferably methyl.

In another preferred embodiment, $R_1$ and $R_2$ in formula (Ia) are hydrogen.

Preferred compounds of formula (Ia) contain 2 to about 8 carbon atoms, and most preferred are ethylene oxide (also called oxyethylene), propylene oxide (also called oxypropylene), 1-butylene oxide, 2-butylene oxide, or styreneoxide.

The term alkoxylation means reacting nitrogen atom(s) of a lactam, polyamide or fatty amine with a compound of formula (Ia). Thus, alkoxylation in the present invention means N-alkoxylation. Thus, an alkoxylated lactam, polyamide, fatty amine, or amide is the reaction product which can be obtained by alkoxylation of the respective compound. Alkoxylation is known to a person skilled in the art and widely described in scientific and patent literature.

Alkoxylated lactams, fatty amines, amides or polyamides can be prepared by using more than one compound of formula (Ia) for alkoxylation. Alkoxylated lactams, fatty amines, amides or polyamides can be prepared by sequential alkoxylation with two or more of the aforementioned compounds, as for example described in U.S. Pat. No. 6,552,091.

The nitrogen containing, adhesion-promoting compound can be selected from one or more of alkoxylated lactams, alkoxylated fatty amines, alkoxylated amides and alkoxylated polyamides, wherein alkoxylation was performed with one or more compounds of formula (Ia).

In one embodiment, the nitrogen-containing, adhesion-promoting compound selected for component d) of a solution of the invention is a lactam of formula (II)

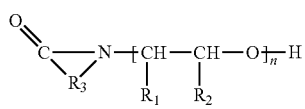

(II)

wherein
n is an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms,
each $R_1$ and $R_2$ in a —(CHR$_1$—CHR$_2$—O)— moiety can be selected independently of each $R_1$ and $R_2$ in another —(CHR$_1$—CHR$_2$—O)— moiety, and
$R_3$ is a hydrocarbon residue with 2 to about 20 carbon atoms.

With respect to special embodiments and combinations of n, $R_1$ and $R_2$ it is referred to the above disclosure as to formula (I).

In one embodiment, which can be combined with all special embodiments and combinations of n, $R_1$ and $R_2$, $R_3$ is $C_2$-$C_{20}$-alkylene, preferably $C_2$-$C_{12}$-alkylene, unsubstituted or substituted by 1, 2, 3, 4, 5 or 6 substituents selected independently of one another from the group consisting of alkylene, cycloalkylene and arylene.

In a preferred embodiment, $R_3$ is an alkylene residue of the formula —(CH$_2$)$_y$—, wherein y is an integer from 2 to about 20, more preferably 2 to about 12, and most preferably 2 to about 7.

In a very preferred embodiment, the lactam selected for component d) of the solution is ethoxylated beta-propiolactam, hexaethoxylated-gamma-butyrolactam, octaethoxylated-delta-valerolactam, pentapropoxylated-delta-valerolactam, hexaethoxylated-epsilon-caprolactam, dodecaethoxylated-epsilon-caprolactam, or a mixture of two or more from these compounds.

Suitable lactams of formula (II) are described in DE3836521, which is incorporated by reference in its entirety.

In a further embodiment, the nitrogen-containing, adhesion-promoting compound selected for component d) of a solution of the invention is a polyamide of formula (III)

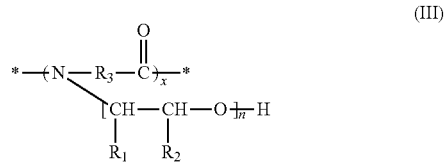

(III)

wherein
n is an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms,
each $R_1$ and $R_2$ in a —(CHR$_1$—CHR$_2$—O)— moiety can be selected independently of each $R_1$ and $R_2$ in another —(CHR$_1$—CHR$_2$—O)— moiety,
$R_3$ is a hydrocarbon residue with 1 to about 20 carbon atoms,
each $R_3$ in a —(N—R$_3$—CO)— moiety can be selected independently of each $R_3$ in another —(N—R$_3$—CO)— moiety, and
each n in a —(CHR$_1$—CHR$_2$—O)$_n$— moiety or chain can be selected independently of each n in another —(CHR$_1$—CHR$_2$—O)$_n$— moiety or chain.

The term "—(CHR$_1$—CHR$_2$—O)$_n$— moiety" is used when n≥1 and term "—(CHR$_1$—CHR$_2$—O)$_n$— chain" is used when n<1.

The (*) signs in formula (III) are intended to show that the moieties —(N—R$_3$—CO)$_n$— form a polymeric chain and "x" in formula (III) is the number of repeating —(CHR$_1$—CHR$_2$—O)— moieties in a polymeric chain, wherein chains with different x can be present.

With respect to special embodiments and combinations of n, $R_1$ and $R_2$ it is referred to the above disclosure as to formula (I).

In one embodiment, which can be combined with all special embodiments and combinations of n, $R_1$, and $R_2$, $R_3$ is $C_2$-$C_{20}$-alkylene, preferably $C_2$-$C_{12}$-alkylene, unsubstituted or substituted by 1, 2, 3, 4, 5 or 6 substituents selected independently of one another from the group consisting of alkylene, cycloalkylene and arylene.

In a preferred embodiment, $R_3$ is an alkylene residue of the formula —(CH$_2$)$_y$—, wherein y is an integer form 2 to about 20, more preferably 2 to about 12, and most preferably 2 to about 7.

A polyamide as described above can, for example, be prepared by ring-opening polymerization of a previously described lactam, or by ring-opening co-polymerization of at least two of the previously described lactams.

Other polyamides which can be employed in the present invention are polyamides which are prepared from dicarboxylic acids and diamines and which are alkoxylated at one or more of their nitrogen atoms with one or more residues of formula (I) as described above. An example is, without restriction, N-alkoxylated Polyamide 6,6, prepared from adipic acid and hexamethylene diamine.

Another suitable polyamide is N-alkoxylated Polyamide 6, particularly N-ethoxylated Polyamide 6, which can be prepared from N-alkoxylated, particularly N-ethoxylated ε-caprolactame.

Polyamides of formula (III) can be prepared from alkoxylated lactams. Alkoxylated lactams are described in DE3836521, which is incorporated by reference in its entirety.

The nitrogen containing adhesion-promoting compound that is used as component d) in the solution of the invention can be a fatty amine which is connected at one or more of its nitrogen atoms with a residue of formula (I) as described above.

Before the residue of formula (I) is attached to the nitrogen atom of the fatty amine, the fatty amine in the present invention is a fatty amine of the general formula $R_7NH_2$ or a fatty amine with the general formula $R_7R_8NH$, wherein $R_7$ and $R_8$ are independently from each other aliphatic residues, preferably with 2 to about 40 carbon atoms. Fatty amines are obtainable from fatty acids, i.e. by reacting fatty acids with ammonia to obtain fatty nitriles, and reacting the fatty nitriles with hydrogen to obtain fatty amines.

The term "fatty acid" means, in the meaning of the present invention, a carboxylic acid with an aliphatic chain, which can, according to the above definition, be saturated or unsaturated, and branched or unbranched. Preferably a fatty acid in the meaning of the present invention contains at least 2 carbon atoms, including the carboxyl C-atom. Fatty acids can encompass naturally occurring fatty acids, hardened fatty acids, modified naturally fatty acids, and synthetically produced fatty acids.

After introduction of one residue of formula (I) to a fatty amine of formula $R_7NH_2$, a secondary amine is formed as the adhesion-promoting compound. After introduction of two residues of formula (I) to a fatty amine of formula $R_7NH_2$, a tertiary amine is formed as the final adhesion-promoting compound. After introduction of one residue of formula (I) to a secondary fatty amine ($R_7R_8NH$), a tertiary amine is formed as the adhesion-promoting compound.

The nitrogen containing, adhesion-promoting compound, particularly the fatty amine which is connected at its nitrogen atom with at least one residue of above formula (I), is a non-quaternary amine compound. In other words, a fatty amine as employed in the present invention, which is connected at its nitrogen atom with at least one residue of formula (I), does not contain, or is not, a quaternary ammonium cation.

Quaternary amine compounds contain a quaternary ammonium cation, which is positively charged and has the general structure $N(R')(R'')(R''')(R'''')^+$, wherein R', R", R"' and R"" are hydrocarbon residues, which can be equal or different from each other and which may contain heteroatoms such as oxygen and nitrogen. Unlike the ammonium ion ($NH_4^+$) and the primary ($NH_3(R')^+$), secondary ($NH_2(R')(R'')^+$), or tertiary ($NH(R')(R'')(R''')^+$) ammonium cations, the quaternary ammonium cations are permanently charged, independent of pH.

The nitrogen-containing, adhesion-promoting compound selected for component d) of a solution of the invention is in one embodiment of the present invention a fatty amine of formula (IV)

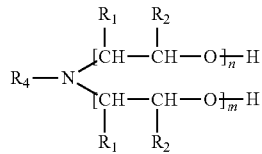

wherein
n and m are independently from each other an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms,
each $R_1$ and $R_2$ in a —$(CHR_1$—$CHR_2$—O)— moiety can be selected independently of each $R_1$ and $R_2$ in another —$(CHR_1$—$CHR_2$—O)— moiety, and
$R_4$ is an aliphatic residue with 2 to about 40 carbon atoms,
With respect to special embodiments and combinations of $R_1$ and $R_2$ it is referred to the above disclosure of formula (I). n and m are independently from each other preferably 1 to about 50.

In one embodiment, which can be combined with all special embodiments and combinations of n, m, $R_1$ and $R_2$, $R_4$ is a $C_{12}$ to $C_{24}$ aliphatic residue, wherein the term aliphatic, as already defined above, encompasses saturated and unsaturated, straight chain and branched residues. Most preferably, $R_4$ is a saturated or unsaturated straight chain $C_{12}$ to $C_{24}$ aliphatic residue.

Compounds of formula (IV) can be obtained by alkoxylation of primary fatty amines with the general formula $R_4$—$NH_2$, wherein $R_4$ is defined as above.

In one embodiment a mixture of compounds of formula (IV) with different residues $R_4$ is employed wherein the compounds of formula (IV) can be prepared by alkoxylation of a mixture of primary fatty amines with different residues $R_4$. The mixture of amines can be obtained from a mixture of different fatty acids which is reacted to fatty amines in known manner. A mixture of different fatty acids can be obtained from a natural source, as for example animal fats or vegetable oils. Examples for vegetable oils are Palm, Soybean, Rapeseed, Sunflower seed, Peanut, Cottonseed, Palm kernel, Coconut, Olive, Corn, Grape seed, Hazelnut, Linseed, Rice bran, Safflower and Sesame oil. Examples for animal fats are tallow, as for example beef tallow, mutton tallow, hardened tallow, and (pig) lard.

In a special embodiment, the compound of formula (IV) is an alkoxylated tallowamine, or an alkoxylated hydrogenated tallowamine. The term "hydrogenated" tallowamine means a tallowamine, wherein unsaturated bonds in fatty acid residues have been transformed to saturated bonds by hydrogenation. In this embodiment n and m in formula (IV) are preferably independently from each other an integer from 1 to about 50 and $R_1$ and $R_2$ are preferably hydrogen.

The term "tallowamine" means a mixture of fatty amines which is obtained from tallow. For producing tallowamines tallow is converted to fatty acids by reactions that are known to an expert skilled in the art, i.e. saponification, and the thus obtained fatty acids are in another step converted to fatty amines by reactions that are known to an expert skilled in the art (c.f. "Fettamine" in Römpp Chemielexikon, Thieme, 1989-1992, ISBN 3-13-102759-2).

In one embodiment, the tallowamine which is basis for the compound of formula (IV) is made from a fatty acid composition obtained from tallow, comprising in weight-%:

Oleic acid: 38-47%
Palmitic acid: 22-28%
Stearic acid: 14-22%
Palmitoleic acid: 2-5%
Myristic acid: 2-5%
Linoleic acid: 2-5%
Margaric acid: 1-4%
Pentadecanoic acid: 1-2%
Myristoleic acid: 0-1%
Linolenic acid: 0-1%
Arachidic acid: 0-1%
Behenic acid: 0-1%

In another embodiment, the tallowamine which is basis for the compound of formula (IV) is made from a fatty acid composition obtained from hydrogenated tallow, comprising in weight-%:
Stearic acid: 50-55%
Palmitic acid: 28-32%
Myristic acid: 2-6%
Margaric acid: 1-4%
Pentadecanoic acid: 0.5-2%
Arachidic acid: 0.5-2%

Preferred fatty amines and tallowamines that can be employed in the present invention Berol 387™, Ethomeen OV/22™ and Ethomeen HT/60™, Products and Trademarks by Akzo-Nobel. Details as to these compounds are presented in the examples.

The nitrogen-containing, adhesion-promoting compound selected for component d) of a solution of the invention is in another embodiment of the present invention a fatty amine of formula (V)

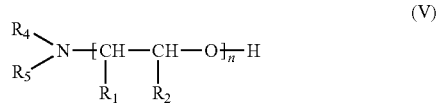

wherein
n is an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms,
each $R_1$ and $R_2$ in a —$(CHR_1$—$CHR_2$—O)— moiety can be selected independently of each $R_1$ and $R_2$ in another —$(CHR_1$—$CHR_2$—O)— moiety, and
$R_4$ and $R_5$ are independently from each other an aliphatic residue with 2 to about 40 carbon atoms.

With respect to special embodiments and combinations of n, $R_1$ and $R_2$ it is referred to the above disclosure of formula (I).

In one embodiment, which can be combined with all special embodiments and combinations of n, $R_1$ and $R_2$, $R_4$ and $R_5$ are independently from each other a $C_{12}$ to $C_{24}$ aliphatic residue, wherein the term aliphatic, as already defined above, encompasses saturated and unsaturated, straight chain and branched, residues. Most preferably, $R_4$ and $R_5$ are independently from each other a saturated or unsaturated straight chain $C_{12}$ to $C_{24}$ aliphatic residue.

Compounds of formula (V) can be obtained by alkoxylation of secondary fatty amines with the general formula $(R_4)(R_5)NH$, wherein $R_4$ and $R_5$ are defined as above.

In one embodiment a mixture of compounds of formula (V) is employed wherein the compounds of formula (V) can be prepared by alkoxylation of a mixture of different secondary fatty amines. A mixture of secondary fatty acid amines can be obtained from a mixture of different fatty acids which is reacted to secondary fatty amines in known manner. As stated above a mixture of different fatty acids can be obtained from a natural source, as for example the above mentioned animal fats or vegetable oils.

In a special embodiment, the compound of formula (V) is an alkoxylated tallowamine or an alkoxylated hydrogenated tallowamine. In this embodiment n in formula (V) is preferably an integer from 1 to about 50 and $R_1$ and $R_2$ are preferably hydrogen. In this connection tallows as described above can be employed as starting material for producing tallowamine.

The nitrogen-containing, adhesion-promoting compound selected for component d) of a solution of the invention is in still another embodiment of the present invention an amide of formula (VI):

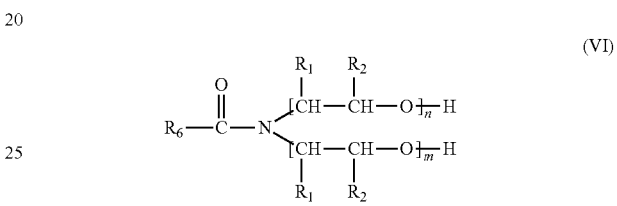

wherein
n and m are independently from each other an integer from 1 to about 100,
$R_1$ is hydrogen or a hydrocarbon residue with 1 to about 6 carbon atoms,
$R_2$ is hydrogen or a hydrocarbon residue with 1 to about 6 carbon atoms,
each $R_1$ and $R_2$ in a —$(CHR_1$—$CHR_2$—O)— moiety can be selected independently of each $R_1$ and $R_2$ in another —$(CHR_1$—$CHR_2$—O)— moiety, and
$R_6$ is an aliphatic residue with 1 to about 39 carbon atoms, With respect to special embodiments and combinations of $R_1$ and $R_2$ it is referred to the above disclosure of formula (I). n and m are independently from each other preferably 1 to about 50.

In one embodiment, which can be combined with all cited embodiments and combinations of n, m, $R_1$ and $R_2$, $R_6$ is a $C_{11}$ to $C_{23}$ aliphatic residue, wherein the term aliphatic, as already defined above, encompasses saturated and unsaturated, straight chain and branched residues. Most preferably, R6 is a saturated or unsaturated straight chain $C_{11}$ to $C_{23}$ aliphatic residue.

The acid which is used as component b) of the solution of the invention is preferably an inorganic acid or mineral acid, as sulfuric acid, hydrochloric acid, nitric acid, phosphoric acid, most preferably sulfuric acid. Other acids can also be employed. The acid is no sulphinic, selenic or telluric acid.

The nitrogen-containing, five-member heterocyclic compounds which is employed as component c) of the solution of the invention can be monocyclic and polycyclic condensed ring systems. For example, the compounds can contain an anellated benzene, naphthalene or pyrimidine ring. When selecting these compounds, make sure that they are sufficiently soluble in the acid solution. It is preferable for the solution to contain triazoles, tetrazoles, imidazoles, pyrazoles and purines or their derivatives.

In particular, the solution contains triazoles of chemical formula (VIIa):

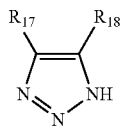

(VIIa)

with $R_{17}$, $R_{18}$=hydrogen, alkyl, substituted alkyl, amino, phenyl, substituted phenyl, carboxyalkyl, where $R_{17}$ and $R_{18}$ can be the same or different and can be a part of the homo or heterocyclic ring condensed onto the triazole ring.

Benzotriazole, methylbenzotriazole, ethylbenzotriazole and dimethylbenzotriazole are particularly preferable.

In addition, the solution can contain tetrazoles of chemical formula (VIIb):

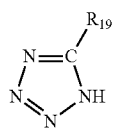

(VIIb)

with $R_{19}$=hydrogen, alkyl, substituted alkyl, halogenalkyl, amino, phenyl, substituted phenyl, benzyl, carboxy, carboxyalkyl, alkoxycarbonyl, aminocarbonyl, $R_{20}$—CONH with $R_{20}$=hydrogen, alkyl, substituted alkyl, phenyl or substituted phenyl.

Preferred tetrazole compounds may be 5-aminotetrazole and 5-phenyltetrazole. A preferred imidazole compound may be benzimidazole. 5-aminotetrazole, 5-phenyltetrazole, benzotriazole, methylbenzotriazole and ethylbenzotriazole are preferred compounds given their favorable solubility in the pretreatment solution and their availability.

Preferred combinations are benzotriazole, methylbenzotriazole, ethylbenzotriazole, 5-aminotetrazole and 5-phenyltetrazole as the nitrogen-containing, heterocyclic compounds with aminothiophene carboxylic acids, their esters and amides, aminothiazoles and substituted aminothiazoles as the heterocyclic compounds.

The nitrogen-containing, five-membered, heterocyclic compound selected for component c) in the solution preferably contains no sulphur atom, no selenium atom or tellurium atom in the heterocycle.

The solution of the present invention can comprise, as a further component in addition to above mentioned components a)-d), at least one sulphur, selenium or tellurium-containing bonding compound which is selected from the group comprising sulphinic acids, selenic acids, telluric acids, heterocyclic compounds which contain at least one sulphur, selenium and/or tellurium atom in the heterocycle, sulphonium salts, selenonium salts and telluronium salts, the sulphonium, selenonium and telluronium salts being compounds having the general formula (VIII):

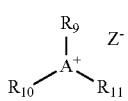

(VIII)

wherein
A=S, Se or Te,
$R_9$, $R_{10}$ and $R_{11}$ are alkyl, substituted alkyl, alkenyl, phenyl, substituted phenyl, benzyl, cycloalkyl, substituted cycloalkyl, $R_9$, $R_{10}$ and $R_{11}$ being identical or different, and Z=anion of an inorganic or organic acid or hydroxide.

If a sulphur, selenium or tellurium-containing bonding compound as mentioned above is added as a further component, the acid selected for component b) in the solution is in any case not identical to the sulphinic, selenic or telluric acids selected for the sulphur, selenium or tellurium containing bonding compound, and the nitrogen-containing, five-membered, heterocyclic compound selected for component c) in the solution contains no sulphur atom, no selenium atom or tellurium atom in the heterocycle.

Preferred sulfinic acids are compounds of chemical formula (IX)

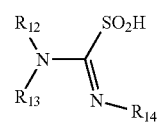

(IX)

with $R_{12}$, $R_{13}$ and $R_{14}$=hydrogen, alkyl, substituted alkyl, phenyl, substituted phenyl or $R_{15}$—(CO)— with $R_{15}$=hydrogen, alkyl, substituted alkyl, phenyl or substituted phenyl, where $R_{12}$, $R_{13}$ and $R_{14}$ can be the same or different, and aromatic sulfinic acids.

It is preferable for the solution to contain formamidine sulfinic acid as the bonding compound. Preferable aromatic sulfinic acids are benzene sulfinic acid, toluene sulfinic acids, chlorobenzene sulfinic acids, nitrobenzene sulfinic acids and carboxybenzene sulfinic acids.

Other preferable heterocyclic bonding compounds are thiophene, thiazole, isothiazole, thiadiazole and thiatriazole.

Suitable thiophenes are compounds of chemical formula (X):

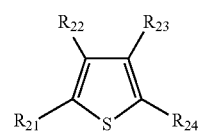

(X)

with $R_{21}$, $R_{22}$, $R_{23}$, $R_{24}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R_{25}$—CONH— with $R_{25}$=hydrogen, alkyl, substituted alkyl, phenyl or substituted phenyl, where $R_{21}$, $R_{22}$, $R_{23}$ and $R_{24}$ can be the same or different and can be a part of homo or heterocyclic rings condensed onto the thiophene ring.

Particularly preferred thiophenes are aminothiophene carboxylic acids, their esters and amides. For example, 3-aminothiophene-2-carboxylic acid methyl ester can be advantageously used.

Suitable thiazoles are compounds of chemical formula (XI):

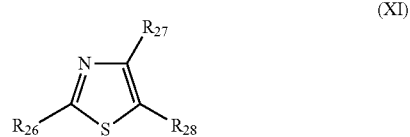

with $R_{26}$, $R_{27}$, $R_{28}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R_{29}$—CONH— with $R_{29}$=hydrogen, alkyl, substituted alkyl, phenyl or substituted phenyl, where $R_{26}$, $R_{27}$ and $R_{28}$ can be the same or different and can be a part of homo or heterocyclic ring condensed onto the thiazole ring.

Particularly suitable thiazoles are aminothiazole and substituted aminothiazole.

Other preferred thiadiazole bonding compounds are from the group, consisting of aminothiadiazoles and substituted aminothiadiazoles.

In addition, the preferred sulfonium salts used as bonding compounds are salts of trimethylsulfonium, triphenylsulfonium, methionine alkylsulfonium and methionine benzylsulfonium.

A further optional component in the solution of the present invention are chloride ions, preferably in concentration of Cl⁻ of 5-500 mg/l, more preferably 10-50 mg/l.

A preferred solvent for the solution is water. Other organic solvents like alcohols, can be added, e.g. to increase the solubility of the contained components, especially the nitrogen-containing, five-member heterocyclic compounds and the sulphur, selenium or tellurium-containing bonding compound.

To stabilize hydrogen peroxide against decomposition, the solution can contain stabilizing compounds, such as p-phenolsulfonic acid.

In addition, other inorganic and organic compounds can be in the solutions, e.g., copper sulfate and wetting agents.

In a further aspect the present invention is directed to a method for the pre-treatment of a copper surface for the subsequent formation of a firmly adhesive bonding between the copper surfaces and plastics material substrates, wherein the copper surface is brought into contact with
a) hydrogen peroxide,
b) at least one acid,
c) at least one nitrogen-containing, five-membered, heterocyclic compound, and
d) at least one nitrogen-containing, adhesion-promoting compound which is selected from the group comprising lactams, non-quaternary fatty amines, amides and polyamides, which is connected at one or more of its nitrogen atoms with at least one residue of formula (I) as defined above.

With respect to components a)-d) that are employed in the method of the invention it is referred to the previous disclosure, including all specific and preferred embodiments.

The term "copper surface" is intended to also include multiple copper surfaces. Thus, the method of the present invention encompasses simultaneous treatment of multiple copper surfaces.

The process according to the invention is an extremely easy way to pretreat copper surfaces to allow them to tightly bond with plastics. The adhesion does not decrease even after a long time. If the adhesion-promoting compound(s) as described above is not in the solution, such bond strength cannot be attained. In addition, the long-term stability of the bond after treating the copper with solution without the invention's adhesion-promoting compounds is substantially lower than when the adhesion-promoting compound is used.

In addition, the problems that arise in conjunction with plating through-holes in printed circuit boards (i.e., the formation of pink ring and wedge voids) are avoided by using the additional adhesion-promoting compound in the treatment solution. The adhesion-promoting layers created using the solution according to the invention have an excellent acid resistance, whereas black oxide and reduced black oxide layers are somewhat sensitive to hydrochloric acid solutions. It has even been shown that the adhesion of copper to organic substrates can be improved in certain cases when the copper surfaces are treated with diluted acid after being treated with components a)-d) as described above and before the bond is created. It is preferable to use an inorganic acid or mineral acid, as sulfuric acid, hydrochloric acid, nitric acid, phosphoric acid, most preferably sulfuric acid.

The copper surface is preferably cleaned to ensure that the pretreatment according to the invention is effective. Any conventional cleaning solution can be used. Normally, wetting agents and sometimes complexer (such as triethanolamine)-containing aqueous solutions are used.

After the cleaned copper surface is rinsed, it can be brought into contact with a so-called predipping solution, also abbreviated as "predip", that contains one of the five-member heterocyclic compounds (component c), preferably at a concentration of 0.1-10 g/l, and especially 0.5-2 g/l. This treatment helps the adhesion-promoting layer to be formed in the subsequent treatment step. In particular, any delays in the formation of the layer are avoided. The surface(s) is/are then treated with components a)-d) without being rinsed beforehand.

The present invention discloses two preferred embodiments how the pre-treatment with components a)-d) can be performed. In the first preferred embodiment, a copper surface is treated with all components a)-d) at the same time with one solution. In the second preferred embodiment, a copper surface is treated sequentially with two solutions, the first solution comprising or containing components a)-c) and the second solution comprising or containing component d).

In the first preferred embodiment of the method of the invention the copper surface is brought into contact with the above-described solution comprising components a)-d). In this connection, all embodiments and preferred embodiments of the solution can be employed in the method. In the first embodiment of the method of the invention, basically one step is necessary, i.e., treating the copper surface with the solution according to the invention to allow them to bond with organic substrates.

As the adhesion-promoting layer is formed, the copper surfaces change color, usually from pink to a brown tint, depending on the combination of nitrogen-containing, five-member heterocyclic and adhesion-promoting compounds.

The microetching by the hydrogen peroxide in connection with the acid yields microrough copper surfaces. Since this increases the surface area, the subsequent adhesion of the copper surfaces to the plastic substrate also increases. The change in color of the surface during treatment is caused by a thin copper oxide layer. It is also suspected that the adhesion is also improved by the formation of a copper organic compound that forms on the copper surface and probably consists of copper or copper oxide, the five-membered, heterocyclic compound, and the nitrogen-containing adhesion-promoting compound. It is preferable for the acid in the solution according to the invention to be an inorganic acid, and especially sulfuric acid. Other acids can of course be used.

The treatment is preferably carried out at 20-60° C. The treatment time is preferably 10-600 sec. The higher the temperature, the faster-acting the solution. The treatment times can hence even be much shorter. From a practical standpoint, a preferable average temperature would be 25-45° C. to better control the reaction. Average treatment times are 20-90 seconds.

In addition, a top temperature limit may have to be set due to possible incompatibilities between certain solution components at high temperatures, e.g., wetting agents that have difficulty dissolving at high temperatures.

The preferable concentration ranges in the solution are:

| | |
|---|---|
| Acid, preferably sulfuric acid conc. | 10-250 g/l |
| Hydrogen peroxide, 30 weight percent | 1-100 g/l |
| (corresponds to hydrogen peroxide concentration of | 0.3-30 g/l) |
| N-containing, five-membered, heterocyclic compound | 0.5-50 g/l |
| Nitrogen-containing, adhesion-promoting compound | |
| lactam | 0.05-10 g/l, preferably 0.1-6 g/l |
| non-quaternary fatty amine | 0.05-10 g/l, preferably 0.1-6 g/l |
| amide | 0.05-10 g/l, preferably 0.1-6 g/l |
| polyamide | 0.05-10 g/l, preferably 0.1-6 g/l |

As stated before, mixtures of different lactams, different fatty amines, different amides, and different polyamides as well as mixtures of two or more of a lactam, non-quaternary fatty amine, amide and polyamide can be employed. If different lactams, fatty amines, different amides, or polyamides are employed, the above concentration range of a component (e.g. lactam) means the total concentration range of the component or mixture of components (e.g. lactam or mixture of lactams). Preferably, the total concentration of a nitrogen-containing adhesion-promoting compound does not exceed 10 g/l.

The optimum concentrations for the cited bath components depend on the type of five-membered heterocyclic compounds and nitrogen-containing adhesion-promoting compounds.

To increase the useful life of the solution, it is a good idea to prepare the ready-for-use treatment solution right before carrying out the procedure. For example, hydrogen peroxide can be mixed with a sulfuric acid solution of the five-membered heterocyclic compound and the nitrogen-containing adhesion-promoting compound, or a prepared solution can be supplemented directly before use to set the desired concentrations of individual components.

In the second preferred embodiment of the method of the invention a copper surface is in a first step brought into contact with a first solution, comprising
 a) hydrogen peroxide,
 b) at least one acid, and
 c) at least one nitrogen-containing, five-membered, heterocyclic compound and in a second step a copper surface is brought into contact with a second solution, comprising
 d) at least one nitrogen-containing, adhesion-promoting compound which is selected from the group comprising lactams, non-quaternary fatty amines, amides and polyamides, which is connected at one or more of its nitrogen atoms with at least one residue of formula (I) as defined above.

The nitrogen-containing, adhesion-promoting compound of the second solution is equal to component d) as described above. Therefore it is referred to all embodiments and preferred embodiments of component d).

Surfaces are treated with the first solution according to the invention containing components a), b) and c) without being rinsed. The substrates can then be rinsed to remove any adhering liquid from the substrate. Subsequently, the surface is treated with second solution comprising component d). The second solution is in the present invention and in the appended examples also called "postdipping solution" or just "postdip". The copper surfaces can also be treated with the second solution directly after being treated with the first solution without being rinsed.

With this treatment, the copper surfaces change color from pink to brown as an adhesion-promoting layer is formed depending on the combination of nitrogen-containing, five-member heterocycle in the first solution and adhesion-promoting compounds in the second solution.

It is preferable for the acid in the first solution to be an inorganic acid, especially sulfuric acid. Of course other acids can be used.

To stabilize hydrogen peroxide against decomposition, other additional compounds can be used in the first solution such as p-phenolsulfonic acid.

Both solutions can contain solvents such as water and additional other organic solvents like alcohols, e.g. to increase the solubility of the contained components, especially the nitrogen-containing, five-member heterocyclic compounds and the adhesion-promoting compounds.

In addition, other inorganic and organic compounds can be in the solutions, e.g., wetting agents. Copper sulfate can also be in the second solution.

The treatment with the two solutions is preferably carried out at 20-60° C. The treatment time is preferably 5-600 s. The higher the temperature, the faster-acting the solution. The treatment times may hence be even much shorter. From a practical standpoint, an average temperature is preferably selected such as 25-45° C. to better control the reaction. Average treatment times are 10-60 seconds. In addition, a top temperature limit may have to be set due to possible incompatibilities between certain components in the solution at high temperatures, e.g., wetting agents that dissolve with difficulty at high temperatures.

The preferable concentration ranges in the solutions are:
First Solution:

| | |
|---|---|
| Acid, preferably sulfuric acid conc. | 10-250 g/l |
| Hydrogen peroxide, 30 weight percent | 1-100 g/l |
| (corresponds to hydrogen peroxide concentration of | 0.3-30 g/l) |
| N-containing, five-membered, heterocyclic compound | 0.5-50 g/l |

Second Solution:

| Nitrogen-containing, adhesion-promoting compound | |
|---|---|
| lactam | 0.05-10 g/l, preferably 0.1-6 g/l |
| non-quaternary fatty amine | 0.05-10 g/l, preferably 0.1-6 g/l |
| amide | 0.05-10 g/l, preferably 0.1-6 g/l |
| polyamide | 0.05-10 g/l, preferably 0.1-6 g/l | and optionally an acid, preferably an inorganic acid, most preferably sulfuric acid, in a concentration of 10-250 g/l.

As stated before, mixtures of different lactams, different fatty amines, different amides, and different polyamides as well as mixtures of two or more of a lactam, non-quaternary fatty amine, amide and polyamide can be employed. If different lactams, fatty amines, different amides, or polyamides are employed, the above concentration range of a component (e.g. lactam) means the total concentration range of the component or mixture of components (e.g. lactam or mixture of lactams). Preferably, the total concentration of a nitrogen-containing, adhesion-promoting compound does not exceed 10 g/l.

The optimum concentrations for the cited bath components depend on the type of nitrogen-containing heterocyclic compounds and adhesion-promoting compounds.

To increase the storage life of the first and second solution of the invention, it is a good idea to prepare the ready-for-use treatment solutions right before carrying out the procedure. For example, the first solution can be created by mixing hydrogen peroxide with a sulfuric acid solution of the nitrogen-containing heterocyclic compound, or a prepared solution can be supplemented directly before use to reach the desired concentrations of individual components.

After having carried out the method of the invention the copper surfaces are rinsed, preferably with warm, deionized water. Then they are dried, e.g. with hot air.

The workpieces with the copper surfaces can be treated in conventional dipping systems. In an alternative for treating the printed circuit boards, it is particularly good to use so-called continuous systems. The boards are guided along a horizontal transport path through the system. They are brought into contact with the treatment solutions by guiding them through a liquid bed between squeezing rollers located at the beginning and end of the treatment path, and/or bringing them into contact with the treatment liquid using suitable nozzles such as spray or surge nozzles. The printed circuit boards can be held in a horizontal or vertical position or at any other angle.

The following examples serve further to clarify the invention:

EXAMPLES

Duraver 104 ML epoxy based 18 μm copper layer cladded innerlayer material (manufacturer: Isola) was treated according to the following process sequence.

At first the samples were treated with a cleaner solution BondFilm® Cleaner Alk (Atotech Deutschland GmbH) for 5 min at 50° C. Afterwards the sample was rinsed and etched with an alternative oxide composition according to the formulations in the following examples for 60-70 seconds at 35° C. The treatment time was adjusted in order to have a comparable etch depth of 1.2 μm for all test specimen. After rinsing again the sample is dried. The complete set of etched samples showed a brown to dark brown surface cosmetic.

All samples were laminated in a multilayer press with a Duraver 104 ML epoxy based prepreg layer according to the material data sheet (manufacturer: Isola). During this procedure the semi cured epoxy prepreg layer is cured and bonded to the treated copper metal surface.

Finally, the adhesion between the micro roughend copper surface and the epoxy polymer was measured. Peel strength values were measured according to the method described in IPC-™-650 Test Methods Manual Number 2.4.8 revision C.

Example 1

Comparative Example

The following aqueous formulation was prepared:

| | |
|---|---|
| Benzotriazole | 10 g/l |
| Hydrogen peroxide 35% | 30 g/l |
| Sulfuric acid 50% | 186 g/l |
| Chloride ions | 20 mg/l |

A peel strength value of 7.5 N/cm was measured after using a treatment time of 60 seconds and successive lamination of a prepreg layer.

Example 2

The solution of example 1 was used except that 1.25 g/l N-ethoxylated Polyamide 6, obtainable from ε-Caprolactamhexaethoxylate monomer, was added to said solution.

After using a treatment time of 70 seconds and successive lamination of a prepreg layer a peel strength value of 9.5 N/cm was measured.

Example 3a

The solution of example 1 was used except that 0.01 g/l of a tallow amine having a residue according to formula (I) with $R_1$ and $R_2$=hydrogen and n=40 (Berol 387®, Akzo Nobel) was added to said solution.

After using a treatment time of 70 seconds and successive lamination of a prepreg layer a peel strength value of 8.0 N/cm was measured.

Example 3b

The solution of example 1 was used except that 0.05 g/l of a tallow amine having a residue according to formula (I) with $R_1$ and $R_2$=hydrogen and n=40 (Berol 387®, Akzo Nobel) was added to said solution.

After using a treatment time of 70 seconds and successive lamination of a prepreg layer a peel strength value of 8.7 N/cm was measured.

Example 3c

The solution of example 1 was used except that 0.1 g/l of a tallow amine having a residue according to formula (I) with $R_1$ and $R_2$=hydrogen and n=40 (Berol 387®, Akzo Nobel) was added to said solution.

After using a treatment time of 70 seconds and successive lamination of a prepreg layer a peel strength value of 8.7 N/cm was measured.

Example 3d

The solution of example 1 was used except that 0.2 g/l of a tallow amine having a residue according to formula (I) with $R_1$ and $R_2$=hydrogen and n=40 (Berol 387®, Akzo Nobel) was added to said solution.

After using a treatment time of 70 seconds and successive lamination of a prepreg layer a peel strength value of 9.5 N/cm was measured.

Example 3e

The solution of example 1 was used except that 0.5 g/l of a tallow amine having a residue according to formula (I) with $R_1$ and $R_2$=hydrogen and n=40 (Berol 387®, Akzo Nobel) was added to said solution.

After using a treatment time of 70 seconds and successive lamination of a prepreg layer a peel strength value of 10.3 N/cm was measured.

Example 4

The solution of example 1 was used except that 0.5 g/l of a hydrogenated tallow alkylamine having a residue according to formula (I) with $R_1$ and $R_2$=hydrogen and n=50 (Ethomeen HT/600®, Akzo Nobel) was added to said solution.

After using a treatment time of 70 seconds and successive lamination of a prepreg layer a peel strength value of 10.3 N/cm was measured.

Example 5

The solution of example 1 was used except that 0.5 g/l of a oleylaminethoxylate (a tertiary amine based on a primary oleyl amine having a residue according to formula (I) with $R_1$ and $R_2$=hydrogen and n=12) (Ethomeen® OV/22, Akzo Nobel) was added to said solution.

After using a treatment time of 70 seconds and successive lamination of a prepreg layer a peel strength value of 9.4 N/cm was measured.

Example 6

A sample treated with a solution according to example 1 was then immersed into an aqueous post dip solution of 1.25 g N-ethoxylated Polyamide 6, obtainable from ε-Caprolactamhexaethoxylate for 30 seconds at 25° C.

After successive lamination of a prepreg layer a peel strength value of 8.9 N/cm was measured.

Example 7

A sample treated with a solution according to example 1 was then immersed into an aqueous post dip solution of 0.2 g N-ethoxylated Polyamide 6, obtainable from ε-Caprolactamhexaethoxylate for 30 seconds at 25° C.

After successive lamination of a prepreg layer a peel strength value of 8.3 N/cm was measured.

The invention claimed is:

1. A solution, comprising:
   a) hydrogen peroxide;
   b) an acid;
   c) a nitrogen-containing, five-membered, heterocyclic compound; and
   d) a lactam or a polyamide, which is connected at one or more of its nitrogen atoms with at least one residue of formula (I):

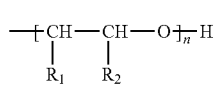

wherein:
n is an integer from 1 to 100;
$R_1$ is hydrogen or a hydrocarbon residue with 1 to 6 carbon atoms;
$R_2$ is hydrogen or a hydrocarbon residue with 1 to 6 carbon atoms; and
each $R_1$ and $R_2$ in a —(CHR$_1$—CHR$_2$—O)— moiety is selected independently of each $R_1$ and $R_2$ in another —(CHR$_1$—CHR$_2$—O)— moiety;
with the proviso that the compound of c) is not connected at any of its nitrogen atoms with a residue of formula (I).

2. The solution of claim 1, wherein the compound of d) is a lactam of formula (II):

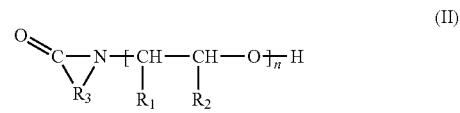

wherein:
n is an integer from 1 to 100;
$R_1$ is hydrogen or a hydrocarbon residue with 1 to 6 carbon atoms;
$R_2$ is hydrogen or a hydrocarbon residue with 1 to 6 carbon atoms;
each $R_1$ and $R_2$ in a —(CHR$_1$—CHR$_2$—O)— moiety is selected independently of each $R_1$ and $R_2$ in another —(CHR$_1$—CHR$_2$—O)— moiety; and
$R_3$ is a hydrocarbon residue with 1 to 20 carbon atoms.

3. The solution of claim 1, wherein the compound of d) is a polyamide of formula (III):

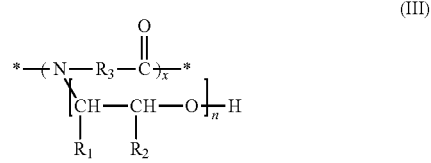

wherein:
n is an integer from 1 to 100;
$R_1$ is hydrogen or a hydrocarbon residue with 1 to 6 carbon atoms;
$R_2$ is hydrogen or a hydrocarbon residue with 1 to 6 carbon atoms;
each $R_1$ and $R_2$ in a —(CHR$_1$—CHR$_2$—O)— moiety is selected independently of each $R_1$ and $R_2$ in another —(CHR$_1$—CHR$_2$—O)— moiety;
$R_3$ is a hydrocarbon residue with 1 to 20 carbon atoms, each $R_3$ in a —(N—R$_3$—CO)— moiety is selected independently of each $R_3$ in another —(N—R$_3$—CO)— moiety; and
each n in a —(CHR$_1$—CHR$_2$—O)$_n$— moiety or chain is selected independently of each n in another —(CHR$_1$—CHR$_2$—O)$_n$— moiety or chain.

4. The solution of claim 2, wherein $R_3$ is an alkylene residue with the formula —(CH$_2$)$_y$—, and wherein y is an integer from 2 to 12.

5. The solution of claim 1, wherein the solution comprises a sulphur, selenium or tellurium-containing adhesion-promoting compound, said compound being a sulphinic acid, selenic acid, telluric acid, heterocyclic compound that comprises at least one sulphur, selenium and/or tellurium atom in the heterocycle, sulphonium salt, selenonium salt or telluronium salt, wherein the sulphonium salt, selenonium salt or telluronium salt has a general formula (VIII);

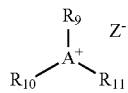
(VIII)

wherein:
A is S, Se or Te;
$R_9$, $R_{10}$ and $R_{11}$ are independently alkyl, substituted alkyl, alkenyl, phenyl, substituted phenyl, benzyl, cycloalkyl, or substituted cycloalkyl; and
$Z^-$ is an anion of an inorganic or organic acid or hydroxide;
with the proviso that the acid of b) is not identical to the sulphinic, selenic or telluric acids selected for the sulphur, selenium or tellurium containing adhesion-promoting compound, and that the compound of c) contains no sulphur atom, selenium atom or tellurium atom in the heterocycle.

6. A method for pre-treating a copper surface for the subsequent formation of a firmly adhesive bond between the copper surface and a plastic material substrate, the method comprising contacting the copper surface with a solution comprising:
a) hydrogen peroxide;
b) an acid;
c) a nitrogen-containing, five-membered, heterocyclic compound; and
d) a lactam or a polyamide, which is connected at one or more of its nitrogen atoms with at least one residue of formula (I)

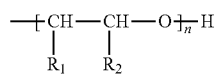
(I)

wherein
n is an integer from 1 to 100;
$R_1$ is hydrogen or a hydrocarbon residue with 1 to 6 carbon atoms;
$R_2$ is hydrogen or a hydrocarbon residue with 1 to 6 carbon atoms; and
each $R_1$ and $R_2$ in a —(CHR$_1$—CHR$_2$—O)— moiety is selected independently of each $R_1$ and $R_2$ in another —(CHR$_1$—CHR$_2$—O)— moiety;
with the proviso that the compound of c) is not connected at any of its nitrogen atoms with a residue of formula (I).

7. The method of claim 6, wherein the copper surface is brought into contact with the solution.

8. A method of pre-treating a printed circuit board inner layer which has a copper layer, the method comprising contacting the printed circuit inner layer or a synthetic resin layer with the solution of claim 1, and forming a firmly adhesive bond between the printed circuit inner layer and the synthetic resin layer.

9. The method of claim 8, wherein the solution comprises a lactam or a polyamide, which is connected at one or more of its nitrogen atoms with at least one residue of formula (I):

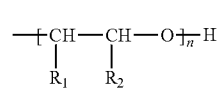
(I)

wherein:
n is an integer from 1 to 100;
$R_1$ is hydrogen or a hydrocarbon residue with 1 to 6 carbon atoms;
$R_2$ is hydrogen or a hydrocarbon residue with 1 to 6 carbon atoms; and
each $R_1$ and $R_2$ in a —(CHR$_1$—CHR$_2$—O)— moiety is selected independently of each $R_1$ and $R_2$ in another —(CHR$_1$—CHR$_2$—O)— moiety.

* * * * *